United States Patent
Hashimoto

(10) Patent No.: US 9,783,910 B2
(45) Date of Patent: Oct. 10, 2017

(54) HIGH PRESSURE REACTOR AND METHOD OF GROWING GROUP III NITRIDE CRYSTALS IN SUPERCRITICAL AMMONIA

(71) Applicants: SIXPOINT MATERIALS, INC., Buellton, CA (US); SEOUL SEMICONDUCTOR CO., LTD., Danwon-gu, Ansan-si, Gyeonggi-do (KR)

(72) Inventor: Tadao Hashimoto, Santa Barbara, CA (US)

(73) Assignee: SixPoint Materials, Inc., Buellton, CA (US)

(*) Notice: Subject to any disclaimer, the term of this patent is extended or adjusted under 35 U.S.C. 154(b) by 0 days.

(21) Appl. No.: 15/194,350

(22) Filed: Jun. 27, 2016

(65) Prior Publication Data
US 2016/0376727 A1    Dec. 29, 2016

Related U.S. Application Data

(60) Provisional application No. 62/184,674, filed on Jun. 25, 2015.

(51) Int. Cl.
*C30B 7/10*    (2006.01)
*C30B 29/40*    (2006.01)
(Continued)

(52) U.S. Cl.
CPC .......... *C30B 7/105* (2013.01); *C01B 21/0632* (2013.01); *C30B 29/406* (2013.01); *H01L 29/2003* (2013.01); *Y02P 20/544* (2015.11)

(58) Field of Classification Search
CPC   C30B 7/10; C30B 7/105; C30B 35/00; Y10T 117/1096
See application file for complete search history.

(56) References Cited

U.S. PATENT DOCUMENTS 3,013,867 A * 12/1961 Sawyer .................. B01D 9/00
117/224
6,656,615 B2   12/2003 Dwiliński et al.
(Continued)

FOREIGN PATENT DOCUMENTS

EP      1514958 A1    3/2005
JP    2013-136466 A    7/2013
(Continued)

OTHER PUBLICATIONS

PCT/US2016/039622 International Search Report and Written Opinion dated Nov. 22, 2016, pp. 17.

*Primary Examiner* — Robert M Kunemund
(74) *Attorney, Agent, or Firm* — Strategic Innovation IP Law Offices, P.C.

(57) ABSTRACT

Provided is a high-pressure reactor suitable for a high-pressure process using supercritical ammonia grow bulk crystal of group III nitride having lateral dimension larger than 2 inches or to form various transition metal nitrides. The reactor has nutrient distributed along the reactor's longitudinal axis and seed material positioned at the reactor's inner wall and along the reactor's longitudinal axis. Nutrient diffuses through supercritical ammonia from the reactor's longitudinal axis and deposits on the seed material positioned by the reactor's inner wall. Both the nutrient and seed material are heated by the same heater. Material growth can primarily be due to material diffusion through supercritical ammonia. This configuration and methodology reduce convective movement of supercritical ammonia due to temperature differential, providing a more quiescent environment in which group III nitride or transition metal nitride is formed.

5 Claims, 2 Drawing Sheets

(51) Int. Cl.
    *C01B 21/06*     (2006.01)
    *H01L 29/20*     (2006.01)

(56) References Cited

U.S. PATENT DOCUMENTS

| | | |
|---|---|---|
| 7,078,731 B2 | 7/2006 | D'Evelyn et al. |
| 7,132,730 B2 | 11/2006 | Dwiliński et al. |
| 7,160,388 B2 | 1/2007 | Dwiliński et al. |
| 2007/0234946 A1 | 10/2007 | Hashimoto et al. |
| 2016/0376726 A1 | 12/2016 | Hashimoto |

FOREIGN PATENT DOCUMENTS

| | | |
|---|---|---|
| WO | WO2006/057463 A1 | 6/2006 |
| WO | WO2007/008198 A1 | 1/2007 |
| WO | WO2007/117689 A2 | 10/2007 |
| WO | WO2016/210428 A1 | 12/2016 |

\* cited by examiner

HIGH PRESSURE REACTOR AND METHOD OF GROWING GROUP III NITRIDE CRYSTALS IN SUPERCRITICAL AMMONIA

CROSS REFERENCE TO RELATED APPLICATIONS

This application claims the benefits of priority to U.S. application Ser. No. 62/184,674 filed Jun. 25, 2015, having the same title and inventors as this application, which application is incorporated by reference in its entirety as if put forth in full below.

This application is related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility patent application Ser. No. 60/973,602, filed on Sep. 19, 2007, by Tadao Hashimoto and Shuji Nakamura, entitled "GALLIUM NITRIDE BULK CRYSTALS AND THEIR GROWTH METHOD,";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,";

U.S. Utility patent application Ser. No. 61/067,117, filed on Feb. 25, 2008, and application Ser. No. 12/392,960 filed Feb. 25, 2009, by Tadao Hashimoto, Edward Letts, Masanori Ikari, entitled "METHOD FOR PRODUCING GROUP III-NITRIDE WAFERS AND GROUP III-NITRIDE WAFERS,";

U.S. Utility patent application Ser. No. 61/058,900, filed on Jun. 4, 2008, and application Ser. No. 12/455,760 filed Jun. 4, 2009, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH,";

U.S. Utility patent application Ser. No. 61/058,910, filed on Jun. 4, 2008, and application Ser. No. 12/455,683 filed Jun. 4, 2009 (now U.S. Pat. No. 8,236,267), by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL,";

U.S. Utility patent application Ser. No. 61/131,917, filed on Jun. 12, 2008, and application Ser. No. 12/456,181 filed Jun. 12, 2009 (now U.S. Pat. No. 8,357,243) by Tadao Hashimoto, Masanori Ikari, Edward Letts, entitled "METHOD FOR TESTING III-NITRIDE WAFERS AND III-NITRIDE WAFERS WITH TEST DATA,";

U.S. Utility patent application Ser. No. 61/106,110, filed on Oct. 16, 2008 and application Ser. No. 12/580,849 filed Oct. 16, 2009, by Tadao Hashimoto, Masanori Ikari, Edward Letts, entitled "REACTOR DESIGN FOR GROWING GROUP III NITRIDE CRYSTALS AND METHOD OF GROWING GROUP III NITRIDE CRYSTALS,";

U.S. Utility patent application Ser. No. 61/694,119, filed on Aug. 28, 2012, by Tadao Hashimoto, Edward Letts, Sierra Hoff, entitled "GROUP III NITRIDE WAFER AND PRODUCTION METHOD,";

U.S. Utility patent application Ser. No. 61/705,540, filed on Sep. 25, 2012, by Tadao Hashimoto, Edward Letts, Sierra Hoff, entitled "METHOD OF GROWING GROUP III NITRIDE CRYSTALS,";

which applications are all incorporated by reference herein in their entirety as if put forth in full below.

BACKGROUND

Field of the Invention

The invention is related to a growth method of group III nitride crystals in supercritical ammonia and the group III nitride crystals grown by the method. A high-pressure reactor is used to grow bulk crystal of group III nitride in supercritical ammonia. Group III nitride crystals are used to produce semiconductor wafers for various devices including optoelectronic devices such as light emitting diodes (LEDs) and laser diodes (LDs), and electronic devices such as transistors. More specifically, the group III nitride includes gallium.

Description of the Existing Technology (Note: This patent application refers several publications and patents as indicated with numbers within brackets, e.g., [x]. A list of these publications and patents can be found in the section entitled "References.")

Gallium nitride (GaN) and its related group III nitride alloys are the key material for various optoelectronic and electronic devices such as LEDs, LDs, microwave power transistors, and solar-blind photo detectors. Currently LEDs are widely used in displays, indicators, general illuminations, and LDs are used in data storage disk drives. However, the majority of these devices are grown epitaxially on heterogeneous substrates, such as sapphire and silicon carbide because GaN substrates are expensive compared to these heteroepitaxial substrates. The heteroepitaxial growth of group III nitride causes highly defected or even cracked films, which hinder the realization of high-end optical and electronic devices, such as high-brightness LEDs for general lighting or high-power microwave transistors.

To solve all fundamental problems caused by heteroepitaxy, it is indispensable to utilize crystalline group III nitride wafers sliced from bulk group III nitride crystal ingots. For the majority of devices, crystalline GaN wafers are favorable because it is relatively easy to control the conductivity of the wafer and GaN wafer will provide the smallest lattice/thermal mismatch with device layers. However, due to the high melting point and high nitrogen vapor pressure at elevated temperature, it has been difficult to grow GaN crystal ingots. Currently, the majority of commercially available GaN substrates are produced by a method called hydride vapor phase epitaxy (HVPE). HVPE is a vapor phase method, which has a difficulty in reducing dislocation density less than $10^5$ $cm^{-2}$.

To obtain high-quality GaN substrates of which dislocation density is less than $10^5$ cm$^{-2}$, a method called ammonothermal growth has been developed [1-6]. Recently, high-quality GaN substrates having dislocation density less than $10^5$ cm$^{-2}$ can be obtained by the ammonothermal growth. The high-pressure reactor of ammonothermal growth must be constructed with Ni—Cr based superalloy due to extreme temperature and pressure conditions. The maximum diameter of a Ni—Cr superalloy reactor is limited by the material of construction, its properties, the high pressure and temperature, and the chemical aggressiveness of the chemicals within the alloy. The chamber diameter of the high-pressure reactor is therefore limited to a rather small maximum value. In order to increase the number of crystals grown simultaneously in one reactor, the reactor length must be extended. However, if the reactor length is extended, the distance between the nutrient and the seed crystal farthest from the nutrient will become too large for crystal growth to occur, since the reactor is a closed or batch reactor due to reactor conditions and limitations on material of construction and since chemical transport is by natural convection within the reactor.

SUMMARY OF THE INVENTION

The present invention discloses a high pressure reactor and a method of growing group III nitride crystal in supercritical ammonia. Unlike the conventional ammonothermal method, there is no baffle to divide the chamber of the high-pressure reactor into a nutrient region and a growth region. A cylindrical high-pressure reactor having a longer longitudinal dimension than radial dimension is used. The nutrient is placed at around the center of the cylinder and along the cylinder's longitudinal axis, and seed crystals are placed on or slightly away from the reactor wall to allow the solution of supercritical ammonia, gallium, and additives to contact both faces of the seed crystal. In other words, all seed crystals are facing the nutrient at any height. The reactor is heated by external heaters so that the temperature of the reactor becomes practically uniform. In other words, the growth environment is controlled so that there is little or no temperature difference along the longitudinal direction, and convective flow inside the reactor is minimized. Crystal growth occurs near the equilibrium condition, contrary to conventional practice. With this unconventional configuration and growth methodology, the number of crystals grown in one batch can be increased dramatically by extending the length of the high-pressure reactor.

BRIEF DESCRIPTION OF THE DRAWINGS

Referring now to the drawings in which like reference numbers represent corresponding parts throughout.

DETAILED DESCRIPTION OF THE INVENTION

Limitation of the Conventional Method

Figure 1:
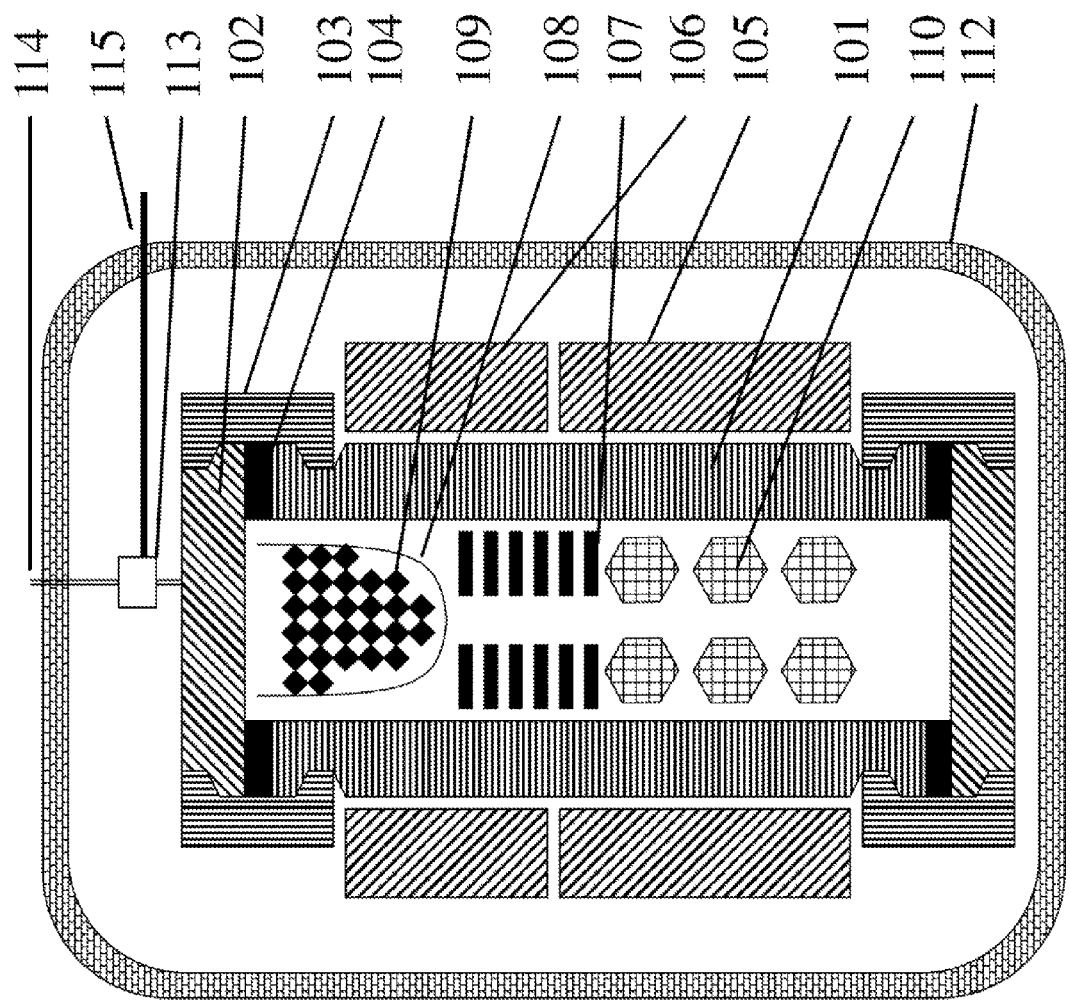
FIG. 1 is a schematic drawing of a cross-section of the conventional ammonothermal growth configuration. In the figure each number represents the following:
101. High-pressure reactor body
102. Lid
103. Clamp
104. Gasket
105. Heater for lower zone
106. Heater for upper zone
107. Baffles
108. Nutrient basket
109. Nutrient
110. Seed crystals
112. Containment cell
113. Exhaust valve
114. Exhaust line
115. Valve operation device

In the conventional ammonothermal method, a cylindrical high-pressure reactor having a longitudinal dimension about ten times larger than the inner diameter is used. The configuration of the conventional ammonothermal growth is shown in FIG. 1. The high-pressure reactor, which consists of a body 101, lids 102, clamps 103 and gaskets 104, is in a vertical configuration, i.e. the cylindrical reactor stands vertical to the ground. The chamber of a high-pressure reactor is primarily divided into an upper region and a lower region with flow-restricting baffles 107. The high-pressure reactor is heated with external heaters. The heaters are split into at least two regions. The heater for the upper zone 106 controls the temperature for the upper region, and the heater for the lower zone 105 controls the temperature for the lower region. To enhance convective flow, the temperature for the lower region is typically set higher than that of the upper region. The system is optionally equipped with a containment cell 112, which allows remote release of ammonia gas with an exhaust valve 113, an exhaust line 114, and valve operation device 115.

One of the regions created by baffles is dedicated to providing nutrient, and the other region is dedicated to crystallization. The regions in which these functions are performed depends on the acidity of the supercritical ammonia. For example, when alkali-based mineralizers are added to ammonia, the supercritical ammonia becomes basic. In ammonobasic solution, group III nitride such as GaN has retrograde solubility. Consequently, nutrient 109 and any basket 108 that contains the nutrient is placed in the upper region of a conventional reactor, and seed crystals 110 are placed in the lower region of a conventional reactor. Conversely, if ammonium halide is added to ammonia, the supercritical ammonia becomes acidic, and group III nitride exhibits normal solubility in acidic solution. Therefore, nutrient 109 is placed in the lower region of the conventional reactor, and seed crystals 110 are placed in the conventional reactor's upper region.

The crystals of group III nitride are grown on the seed crystals at temperature range from 400 to 600° C. and pressure range from 10,000 to 60,000 psi. Due to the high temperature and extremely high pressure, the high-pressure reactor is typically constructed with Ni—Cr based superalloy. Since it is difficult to produce large-diameter billet of Ni—Cr superalloy, the maximum diameter of the billet is limited, which limits the diameter of the chamber of the high-pressure reactor. In order to increase the number of crystals grown simultaneously in one reactor, it is necessary to extend the length of the high-pressure reactor. However, if the reactor length becomes too long, the distance between the nutrient and the seed crystal farthest from the nutrient becomes too large for the precursor to reach the surface of the seed crystal. Thus, the growth rate on the crystal farthest from nutrient becomes too small or even zero due to nutrient depletion and poor convective circulation to the farthest crystal. This is the fundamental limitation of the conventional ammonothermal growth. In the conventional ammonothermal reactor, the longitudinal dimension is typically about ten times of the inner diameter. Therefore, with the conventional method, it is quite difficult to grow crystals with a reactor having more than ten times larger, fifteen times larger, or twenty times larger longitudinal dimension than the inner diameter.

Technical Description of the Invention

Figure 2:
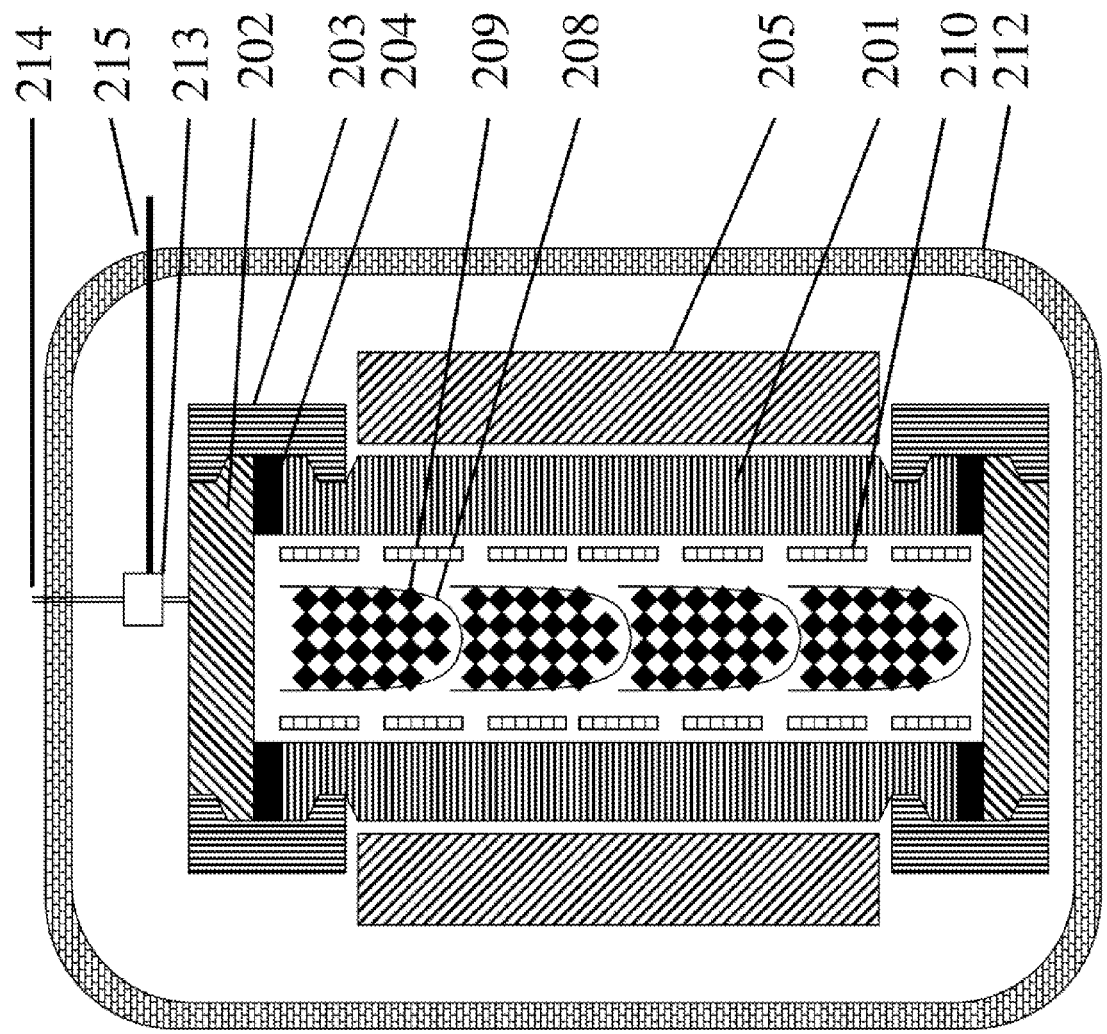
FIG. 2 is a cross-sectional view of one example of a reactor configuration in the current invention. In the figure each number represents the following:
201. High-pressure reactor body
202. Lid
203. Clamp
204. Gasket
205. Heater
208. Nutrient basket
209. Nutrient
210. Seed crystals
212. Containment cell
213. Exhaust valve
214. Exhaust line
215. Valve operation device

To overcome the limitation of the conventional ammonothermal method, the present invention locates nutrient close enough to all seed crystals in the reactor. As shown in FIG. 2, the high-pressure reactor consists of a body 201, lids 202, clamps 203 and gaskets 204. Unlike the conventional ammonothermal method, nutrient 209 is located at around the center of the reactor along the longitudinal direction. Seed crystals 210 are placed near or on the wall so that basal planes of the seeds face against the nutrient. Both nutrient and seed crystals can extend more than 75% of the length of the reactor along the longitudinal direction. With this configuration, practically all seed crystals are located at similar distance from the nutrient; the distance from one seed crystal to the nearest nutrient is within 10% difference from the average distance from one seed crystal to the nearest nutrient. Since the nutrient is close enough to the seed crystals, convective flow is not needed. Nutrient can diffuse to the seeds due to concentration gradient. Therefore, baffles which provide a temperature difference between a nutrient zone and a seed zone in the conventional ammonothermal method are eliminated. Also, the reactor is heated so that the entire length of the reactor achieves as uniform of a temperature as possible. The reactor can be placed vertically, horizontally, or diagonally if desired.

The crystals of group III nitride are grown on the seed crystals at temperature range from 400 to 600° C. and pressure range from 10,000 to 60,000 psi. Due to the extremely high temperature and high pressure, the high-pressure reactor is typically constructed with Ni—Cr based superalloy. Since it is difficult to produce a large-diameter billet of Ni—Cr superalloy, the maximum diameter of the billet is limited, which limits the diameter of the chamber within the high-pressure reactor. To increase the number of crystals simultaneously grown in one reactor, the reactor length can be extended without suffering growth rate for all seed crystals in the new reactor provided herein.

As shown in FIG. 2, nutrient such as small pieces of polycrystalline GaN and/or metallic Ga can be held within multiple baskets 208 that can be stacked upon one another or other container or containers that allow supercritical ammonia to access the containers. Seed crystals can be placed on open frames or solid platforms such as susceptor plates. In the case of an open frame, both sides of the seed crystal are exposed to the supercritical ammonia solution during growth. Seeds may be positioned around the inner circumference of the reactor so that seed major surfaces (basal planes) are approximately perpendicular to the reactor's radius, as depicted in FIG. 2. However, due to distance from the nutrient, growth rate on the seed's major surface that is opposite to the nutrient is slower than on the seed's major surface that faces the nutrient. Seeds may of course be positioned so that seed edges directly face the nutrient and major surfaces of the seeds are positioned approximately parallel to the reactor's radius, with major surfaces of seeds being either approximately parallel to the reactor's longitudinal axis and/or with major surfaces of seeds being perpendicular to the reactor's longitudinal axis. When a seed crystal is mounted on a solid susceptor plate, one side of the seed crystals directly touches the plate, thus a crystal grows only on the exposed basal plane which faces the nutrient.

The reactor can have seed crystals distributed completely around the circumference of the sidewall facing the reactor's chamber and vertically along most or all of the reactor's length. The reactor of the invention therefore enables one to place many more seeds within a reactor than can be placed within a conventional reactor, even before one extends the length of the reactor beyond conventional reactor lengths.

To obtain crystals having the same property on all seeds, it is better to minimize the temperature difference along the reactor. However, this does not necessarily mean that the heater should be one zone or unitary. Rather, it is useful to have multiple heating zones along the reactor to obtain uniform temperature along the reactor. With uniform heating of the reactor, the convective flow of supercritical ammonia is minimized. Although the detailed growth mechanism is not well understood, group III nitride (and especially GaN) crystal grows under near equilibrium condition without temperature difference between the nutrient and the seed crystal on which new crystal grows. Crystal may grow through diffusion-driven mass transport caused by difference in precursor concentration between nutrient and seeds. The difference in precursor concentration may be caused by different dissolution speed between nutrient and seed crystals, which may be caused by different surface area between nutrient and seed crystals.

The reactor may also have heaters positioned facing each end of the reactor (for example, facing a lid at each end of the reactor when the reactor has lids at both ends). This configuration can provide a more uniform temperature along the entire length of the reactor, allowing seeds to be placed closer to ends of the reactor that would otherwise be cooler than the reactor's mid-portion.

Since convective flow can be minimized in the present invention, crystal growth fluctuation caused by turbulent ammonia flow can be minimized. This can lead to better crystal quality of group III nitride grown in this method. Dislocation density of group III nitride such as GaN is preferably reduced to the order of $10^4$ cm$^{-2}$ or less, and crack formation is also preferably reduced and minimized.

The reactor can be used to grow single-crystal group III nitride or polycrystalline group III nitride, for example. The reactor can also be used to form other compounds, crystalline or otherwise, such as transition metal nitrides.

EXAMPLE 1

Growth of GaN in the Conventional Ammonothermal Configuration

A cylindrical high-pressure reactor having inner diameter more than 2", made of precipitation hardenable Ni—Cr superalloy has openings on both ends. The lids are made of another type of precipitation hardenable Ni—Cr superalloy. The gasket is made of Ni-based alloy having Ni content higher than 99%. The chamber of the reactor is divided into two regions with baffle plates. Polycrystalline GaN used as nutrient is held in two baskets made of nickel mesh. Total amount of polycrystalline GaN in each basket is approximately 600 g. These baskets are placed above the top baffle plate. Below the bottom baffle plate, there are several layers of seed frames. Each layer has at least one seed crystal of single crystalline GaN. Approximately 400 g of sodium used as a mineralizer is contained in a capsule which is equipped with a rupture disk. When ammonia pressure increases after heating, the rupture disk breaks and sodium mixes with ammonia. After charging these components, the reactor is sealed, evacuated and filled with ammonia. The total amount of ammonia is about 7 kg. Then, the reactor is heated to a back-etching condition to remove top surface of the seed crystals. During the back-etching, the temperature for the nutrient zone is set at about 400° C., which is about 50° C. higher than that for the seed zone. GaN crystal growth is conducted for 4 days at about 550° C. The temperature for the seed region is set about 30° C. higher than the temperature for the nutrient region. After the growth, the crystal thickness is measured and the growth rate is calculated. The growth rate of GaN on the seed located at the top of the frame is about 113 microns/day, the growth rate on the seed located at the middle of the frame is about 104 microns/day, and the growth rate on the seed located at the bottom of the frame is about 64 micron/day. This shows that the precursor supplied from the nutrient zone is consumed as the ammonia flow passes through each layer of seed frame and is depleted when it reaches the seed crystal at the bottom.

EXAMPLE 2

Present Invention with Sodium Mineralizer

A cylindrical high-pressure reactor having inner diameter more than 2", made of precipitation hardenable Ni—Cr superalloy has openings on both ends. The lids are made of another type of precipitation hardenable Ni—Cr superalloy. The gasket is made of Ni-based alloy having Ni content higher than 99%. The length of the reactor is more than 10 times of the diameter. Polycrystalline GaN used as nutrient is held in ten baskets made of nickel mesh. Total amount of polycrystalline GaN in each basket is approximately 600 g. These baskets are stacked along the center line of the reactor. A seed susceptor is a long slab with one side fit to the curved wall of the reactor and the other side shaped flat. Six susceptors fill the entire circle of the inner wall, i.e. each susceptor cover ⅙ of the inner circle of the reactor. The length of the slab is approximately the same as the length of the reactor, which is more 75% of the total length of the reactor. Seed crystals are fixed against the flat surface of the susceptors in an array from the top to the bottom. When the susceptors are fixed on the inner wall of the reactor, the distance from each seed to the closest nutrient become practically constant at any height, i.e. the distance from nutrient to each seed is within 10% of errors from the averaged distance from nutrient to seed crystals. The total surface area of the nutrient is more than one order of magnitude larger than the total surface area of the seed crystal. Approximately 300 g of sodium used as a mineralizer is contained in a capsule which is equipped with a rupture disk. The capsule is located at any convenient location, such as the bottom of the reactor. When ammonia pressure increases after heating, the rupture disk breaks and sodium mixes with ammonia. After charging these components, the reactor is sealed, evacuated and filled with ammonia. The total amount of ammonia is about 4 kg. Then, the reactor is heated uniformly. During the ramp up, both GaN nutrient and seeds dissolve into the ammonia, which provides back-etching of the seed crystals. When the temperature reaches the growth temperature, the reactor is maintained at a constant temperature for 4 days. After growth, growth rate of GaN on each seed is evaluated. The growth rate for the uppermost seed is approximately 89 microns/day and the growth rate for the lowermost seed is approximately 92 microns/day. All seeds shows similar growth rate regardless of the location.

EXAMPLE 3

Present Invention with Ammonium Chloride Mineralizer

GaN can be grown by substituting ammonium chloride mineralizer for sodium mineralizer in Example 2. Although the temperature dependence of the solubility is opposite for acidic mineralizer, GaN grows with the same reactor configuration as found in Example 2. The same reactor configuration can therefore be used for an ammonothermal method in which the supercritical solution is acidic and for a method in which the solution is basic. Although the growth mechanism is not well known, GaN may grow with difference in precursor concentration between the nutrient area and seed area. Growth rate is similar to Example 2 and does not change with seed location, contrary to how growth occurs in a conventional ammonothermal reactor configured for basic solution or configured for acidic solution.

The invention therefore provides, by way of example and not by way of limitation on the scope of the invention, the following:
1. A method of growing group III nitride crystals using a cylindrical reactor having longitudinal dimension more than ten times larger than the inner diameter comprising:
   (a) placing nutrient which contains group III element along the longitudinal direction of the cylindrical reactor;
   (b) placing group III nitride seed crystals on or near the wall of the cylindrical reactor so that each seed faces the nutrient;
   (c) placing a mineralizer which contains either alkali metal or halogen elements inside the cylindrical reactor;
   (d) filling ammonia in the cylindrical reactor;
   (e) heating the cylindrical reactor with external heaters to create supercritical ammonia.
2. A method according to paragraph 1, wherein the cylindrical reactor does not have a flow restricting plate inside to separate the nutrient and the seed crystals.
3. A method according to paragraph 1 or paragraph 2, wherein the both nutrient and seed crystals extend more than 75% of the length of the reactor along the longitudinal direction.
4. A method according to any one of paragraphs 1-3, wherein one side of the basal plane of each seed crystal faces the nutrient.
5. A method according to any one of paragraphs 1-4, wherein the distance from one seed crystal to the nearest nutrient is practically same for all seed crystals in the cylindrical reactor.
6. A method according to any one of paragraphs 1-5, wherein the distance from one seed crystal to the nearest nutrient is within 10% difference from the average distance from one seed crystal to the nearest nutrient.
7. A method according to any one of paragraphs 1-6, wherein the cylindrical reactor is heated at practically uniform temperature.
8. A method according to any one of paragraphs 1-7, wherein the nutrient is selected so that the dissolution speed in the supercritical ammonia is faster than that of the seed crystal.
9. A method according to any one of paragraphs 1-8, wherein the total surface area of the nutrient is larger than the total surface area of the seed crystal.
10. A method according to any one of paragraphs 1-9, wherein the nutrient contains polycrystalline gallium nitride.
11. A method according to any one of paragraphs 1-10, wherein seed crystals are single crystalline or highly oriented polycrystalline gallium nitride.
12. A method according to any one of paragraphs 1-11, wherein the mineralizer is selected from metallic lithium, metallic sodium, metallic potassium, lithium amide, sodium amide, potassium amide, fluorine, chlorine, bromine, iodine, ammonium fluoride, ammonium chloride, ammonium bromide or ammonium iodide.
13. A method according to any one of paragraphs 1-12, wherein the group III nitride is gallium nitride.
14. A method according to any one of paragraphs 1-13, wherein the longitudinal dimension of the cylindrical reactor is more than fifteen times larger than the inner diameter.
15. A method according to any one of paragraphs 1-14, wherein the longitudinal dimension of the cylindrical reactor is more than twenty times larger than the inner diameter.
16. A bulk crystal of group III nitride grown by the method of any one of paragraphs 1-15.
17. A group III nitride wafer produced from a bulk crystal of group III nitride in paragraph 16.
18. A high pressure reactor for growing group III nitride in an ammonothermal growth process comprising
(a) a cylindrical reactor body defining a chamber and having a longitudinal axis and an inner sidewall parallel to the longitudinal axis;
(b) a nutrient container extending along a majority of the longitudinal axis of the cylindrical reactor body;
(c) one or more seed retainers adjacent to the inner sidewall of the cylindrical reactor body and extending along a majority of the longitudinal axis of the cylindrical reactor body.
19. A high pressure reactor according to paragraph 18 wherein said seed retainers are distributed around a circumference of the cylindrical reactor body to locate seeds around the circumference and the majority of the longitudinal axis of the cylindrical reactor body.
20. A high pressure reactor according to paragraph 18 or paragraph 19 wherein the reactor body has no baffle within the chamber.
21. A high pressure reactor according to any one of paragraphs 18-20 wherein the nutrient container comprises a plurality of stackable baskets.
22. A high pressure reactor according to any one of paragraphs 18-21 wherein the nutrient container and the seed retainers are positioned to be heated by the same heater that is positioned external to the reactor's cylindrical body.
23. A gallium nitride crystal formed by an ammonothermal method and having a dislocation density on the order of $10^4$ cm$^{-2}$.
24. A gallium nitride crystal having a dislocation density on the order of $10^4$ cm$^{-2}$ and containing an amount of a mineralizer.
25. A crystal according to paragraph 23 or paragraph 24 wherein the crystal is a bulk crystal.
26. A method of growing group III nitride crystals comprising
(a) dissolving a nutrient formed of a group III element in supercritical ammonia;
(b) transporting dissolved nutrient to a plurality of group III nitride seeds using the supercritical ammonia;
(c) simultaneously depositing the dissolved nutrient on the plurality of group III nitride seeds, wherein the nutrient is dissolved and deposited without providing a temperature differential between the dissolving and the depositing of the nutrient.
27. A method according to paragraph 26 wherein a transport mechanism for the dissolved nutrient is primarily diffusion through the supercritical ammonia due to a concentration gradient in the supercritical ammonia between the vicinity of the nutrient and the vicinity of the seeds.
28. A method according to paragraph 26 or paragraph 27 wherein convective flow of the supercritical ammonia is reduced because of the lack of the temperature differential between the nutrient dissolving and the nutrient depositing.

Advantages and Improvements

In the conventional ammonothermal method, the nutrient and seed crystals are separated vertically with baffles. If the reactor length is extended the distance from nutrient to the furthermost seed crystal becomes too far to yield crystal growth. On the other hand, in the present invention, group III nitride crystals can be grown in supercritical ammonia while maintaining a similar growth rate for all seed crystals in the reactor even if the length of reactor is extended. Compared with other bulk crystal growth method of group III nitride such as HVPE, the growth rate in the ammonothermal method is quite low. Therefore, it is crucial to increase the number of crystals grown in one batch in a reactor. With the present invention, the reactor length can be extended without losing growth rate for all seed crystals.

Possible Modifications

Although the preferred embodiment describes sodium or ammonium chloride mineralizers, other mineralizers selected from metallic lithium, metallic potassium, lithium amide, sodium amide, potassium amide, ammonium fluoride, ammonium bromide, ammonium iodide, fluorine, chlorine, bromine, iodine can be used without losing the purpose of the invention.

Although the preferred embodiment describes gallium nitride, the present invention can be also applied to other group III nitride such as aluminum nitride, indium nitride, gallium aluminum nitride or other alloys.

Although the preferred embodiment describes a seed susceptor to hold seed crystals, other structures such as seed frames to hang crystals can be used.

The reactor has a cylindrical shape and can be made of precipitation hardenable Ni—Cr based superalloy. The reactor has at least one lid made of precipitation hardenable Ni—Cr based superalloy on one end but may have two lids, one at each end. The lid can be sealed with a gasket made of Ni-based metal of which Ni content is higher than that of the precipitation hardenable Ni—Cr based superalloy.

REFERENCES

The following references are incorporated by reference herein:

[1] R. Dwiliński, R. Doradziński, J. Garczyński, L. Sierzputowski, Y. Kanbara, U.S. Pat. No. 6,656,615.
[2] R. Dwiliński, R. Doradziński, J. Garczyński, L. Sierzputowski, Y. Kanbara, U.S. Pat. No. 7,132,730.
[3] R. Dwiliński, R. Doradziński, J. Garczyński, L. Sierzputowski, Y. Kanbara, U.S. Pat. No. 7,160,388.
[4] K. Fujito, T. Hashimoto, S. Nakamura, International Patent Application No. PCT/US2005/024239, WO07008198.
[5] T. Hashimoto, M. Saito, S. Nakamura, International Patent Application No. PCT/US2007/008743, WO07117689. See also US20070234946, U.S. application Ser. No. 11/784,339 filed Apr. 6, 2007.
[6] D'Eyelyn, U.S. Pat. No. 7,078,731.

Each of the references above is incorporated by reference in its entirety as if put forth in full herein, and particularly with respect to description of methods of making using ammonothermal methods and using these gallium nitride substrates.

What is claimed is:

1. A high pressure reactor for growing group III nitride in an ammonothermal growth process comprising
   (a) a cylindrical reactor body defining a chamber and having a longitudinal axis and an inner sidewall parallel to the longitudinal axis;
   (b) a nutrient container extending along a majority of the longitudinal axis of the cylindrical reactor body;
   (c) one or more seed retainers adjacent to the inner sidewall of the cylindrical reactor body and extending along a majority of the longitudinal axis of the cylindrical reactor body.

2. A high pressure reactor according to claim 1, wherein said seed retainers are distributed around a circumference of the cylindrical reactor body to locate seeds around the circumference and the majority of the longitudinal axis of the cylindrical reactor body.

3. A high pressure reactor according to claim 1, wherein the reactor body has no baffle within the chamber.

4. A high pressure reactor according to claim 1, wherein the nutrient container comprises a plurality of stackable baskets.

5. A high pressure reactor according to claim 1, wherein the nutrient container and the seed retainers are positioned to be heated by the same heater that is positioned external to the reactor's cylindrical body.

* * * * *